United States Patent [19]
Switzer et al.

[11] Patent Number: 5,983,790
[45] Date of Patent: Nov. 16, 1999

[54] FOIL SCREEN REGISTERING APPARATUS AND METHOD

[75] Inventors: Calvin J. Switzer, Hillsdale; Popatlal D. Patel, Elmwood Park, both of N.J.

[73] Assignee: PNC2, Inc., Nutley, N.J.

[21] Appl. No.: 09/067,653

[22] Filed: Apr. 27, 1998

[51] Int. Cl.⁶ ................................................. B41F 15/36
[52] U.S. Cl. ...................... 101/127.1; 101/127; 101/128; 101/128.1; 38/102.1; 38/102.91; 269/903; 29/446
[58] Field of Search ................................. 29/446; 269/47, 269/903; 101/127, 127.1, 128, 128.1; 38/102.91, 102.3, 102.1; 160/376, 404, 382

[56] References Cited

U.S. PATENT DOCUMENTS

| | | |
|---|---|---|
| 925,366 | 6/1909 | Mason . |
| 2,693,205 | 11/1954 | Coulter . |
| 2,803,086 | 8/1957 | Ross . |
| 2,854,922 | 10/1958 | Leibenguth . |
| 3,289,220 | 12/1966 | Grimshaw . |
| 3,303,777 | 2/1967 | Freir et al. . |
| 3,416,445 | 12/1968 | Krueger, Jr. . |
| 3,466,706 | 9/1969 | Asano . |
| 3,826,483 | 7/1974 | Siegel . |
| 4,442,772 | 4/1984 | Bubley . |
| 4,642,924 | 2/1987 | Sudderth et al. . |
| 4,660,308 | 4/1987 | Dang et al. . |
| 4,967,655 | 11/1990 | Holderegger et al. . |
| 5,111,743 | 5/1992 | Umaba et al. . |
| 5,220,867 | 6/1993 | Carpenter . |
| 5,271,171 | 12/1993 | Smith . |
| 5,347,925 | 9/1994 | Holderegger . |
| 5,379,691 | 1/1995 | Hamu et al. . |
| 5,566,840 | 10/1996 | Waldner et al. . |
| 5,669,970 | 9/1997 | Balog et al. . |
| 5,819,651 | 10/1998 | Zepic et al. . |

FOREIGN PATENT DOCUMENTS

| | | |
|---|---|---|
| 3017-139 | 11/1981 | Germany . |
| 921813 | 3/1963 | United Kingdom . |
| 2292115 | 2/1996 | United Kingdom . |

*Primary Examiner*—David P. Bryant
*Assistant Examiner*—John Preta
*Attorney, Agent, or Firm*—Arthur Jacob

[57] ABSTRACT

A foil screen is held in registration with a printed circuit board during the application of solder paste on the printed circuit board, within a frame assembly with a prescribed tension by providing a rigid frame for juxtaposition with the foil screen, engaging the foil screen with at least one coupler, engaging the one coupler with a tensioner for resiliently biasing the one coupler to exert a tensioning force of prescribed magnitude upon the foil screen to tension the foil screen with the prescribed tension, and selectively applying an actuating force to the one coupler, the actuating force being opposite to the tensioning force, and selectively releasing the actuating force from the one coupler, such that upon actuation of the actuator to apply the actuating force, the tensioning force is overcome for release of the foil screen from the one coupler, and upon actuation of the actuator to release the actuating force, the one tensioner resiliently biases the one coupler to exert the tensioning force of prescribed magnitude upon the foil screen.

21 Claims, 4 Drawing Sheets

FOIL SCREEN REGISTERING APPARATUS AND METHOD

The present invention relates generally to the manufacture of circuit boards and pertains, more specifically, to the placement of pads of solder paste in a prescribed pattern on a printed circuit board being prepared for the surface mounting of components onto the circuit board by subsequent soldering.

Current manufacturing techniques for making printed circuit boards call for the mounting of components to the circuit board by "surface mounting". That is, rather than passing the leads of a component through holes in a circuit board and then soldering the leads at the holes, the circuit board is provided with pads of solder paste and the components are placed on the pads for soldering directly to the surface of the board.

In order to place the pads of paste in appropriate locations on the circuit board, just before affixing the components to the board, a stencil-like screen is juxtaposed with the circuit board and provides a pattern of openings registered with the locations where the pads are to be placed. The paste then is spread over the screen with a squeegee to lay down the pattern of pads. The screen is in the form of a thin foil which is supported by a rigid frame in an appropriately tensioned state. The frame fits into a machine which registers the tensioned screen with the circuit board and then applies the paste.

Current practice requires a complete screen and frame assembly for each pattern. The present invention provides a universal frame which enables a manufacturer to use only one frame and interchangeable screens. As such, the present invention attains several objects and advantages, some of which are summarized as follows: Eliminates the need to stock multiple frames and requires only the stocking of less bulky and more easily handled screens; reduces expense by requiring only a single frame for use with multiple alternative screens; allows speed and accuracy in the changing of foil screens for providing different patterns of solder paste for different circuit boards, without the bulk and expense of multiple frames; attains appropriate tensioning and registration of a foil screen without the necessity for specialized tools and a high degree of skill; facilitates preparations for the soldering of surface mounted components to circuit boards in a variety of patterns; reduces the cost of manufacture of circuit boards by reducing the complexity and number of component parts employed in the manufacture of circuit boards; provides a rugged construction for exemplary performance over a long service life.

The above objects and advantages, as well as further objects and advantages, are attained by the present invention which may be described briefly as a frame assembly for holding a foil screen in registration with a printed circuit board during the application of solder paste on the printed circuit board, the foil screen having a perimeter and being tensioned within the frame assembly with a prescribed tension, the frame assembly comprising: a rigid frame for juxtaposition with the foil screen along the perimeter of the foil screen; couplers for engaging the foil screen adjacent the perimeter of the foil screen; at least one tensioner carried by the frame and engaged with one of the couplers for resiliently biasing the one coupler to exert a tensioning force of prescribed magnitude upon the foil screen to tension the foil screen with the prescribed tension; and at least one actuator carried by the frame for selectively applying an actuating force to the one coupler, the actuating force being opposite to the tensioning force, and for selectively releasing the actuating force from the one coupler, such that upon actuation of the actuator to apply the actuating force, the tensioning force is overcome for release of the foil screen from the one coupler, and upon actuation of the actuator to release the actuating force, the one tensioner resiliently biases the one coupler to exert the tensioning force of prescribed magnitude upon the foil screen.

Further, the present invention includes an improvement in a method for holding a foil screen in registration with a printed circuit board during the application of solder paste on the printed circuit board, the foil screen having a perimeter and being tensioned within the frame assembly with a prescribed tension, the improvement comprising: providing a rigid frame for juxtaposition with the foil screen along the perimeter of the foil screen; engaging the foil screen adjacent the perimeter of the foil screen with at least one coupler; engaging the one coupler with a tensioner for resiliently biasing the one coupler to exert a tensioning force of prescribed magnitude upon the foil screen to tension the foil screen with the prescribed tension; and selectively applying an actuating force to the one coupler, the actuating force being opposite to the tensioning force, and selectively releasing the actuating force from the one coupler, such that upon actuation of the actuator to apply the actuating force, the tensioning force is overcome for release of the foil screen from the one coupler, and upon actuation of the actuator to release the actuating force, the one tensioner resiliently biases the one coupler to exert the tensioning force of prescribed magnitude upon the foil screen.

The invention will be understood more fully, while still further objects and advantages will become apparent, in the following detailed description of a preferred embodiment of the invention illustrated in the accompanying drawing, in which.

Figure 1:
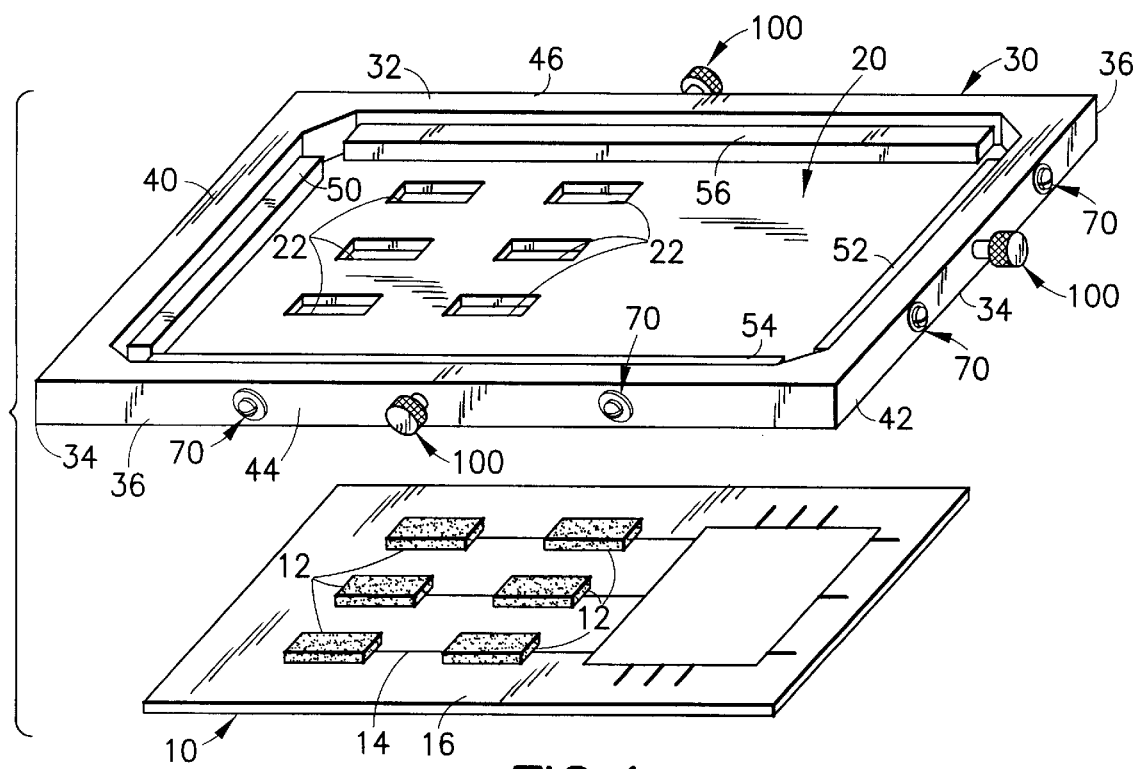
FIG. 1 is a top perspective view showing a circuit board being prepared for the reception of surface mounted components.

Referring now to the drawing, and especially to FIG. 1 thereof, a circuit board 10 has been prepared for the reception of surface mounted electronic circuit components (not shown) by the provision of pads 12 of solder paste placed in a pattern 14 upon a surface 16 of the circuit board 10. Pattern 14 of solder paste pads 12 accurately locates the pads 12 and provides a precise amount of solder paste at each location where an electronic circuit component will be soldered in place in the circuit provided by the circuit board 10, all as is conventional in the manufacture of circuit boards.

The pads 12 of solder paste have been placed in appropriate locations on the circuit board 10 by utilizing a stencil-like screen placed over the circuit board 10, juxtaposed in accurate registration with the circuit board 10. The stencil-like screen is shown in the form of a relatively thin metal foil screen 20 having a perimeter which follows a generally rectangular plan configuration, and openings 22 corresponding to the area and location of each solder paste pad 12. The foil screen 20 is supported adjacent the peripheral edge 24 of the screen 20 in a frame assembly 30 which holds the screen 20 tensioned with a prescribed tension so that when juxtaposed with the circuit board 10, the screen 20 is placed in accurate registration with the circuit board 10 and is maintained against the surface 16 of the circuit board 10 for the application of solder paste to establish with precision the pattern 14 of pads 12.

Figure 2:
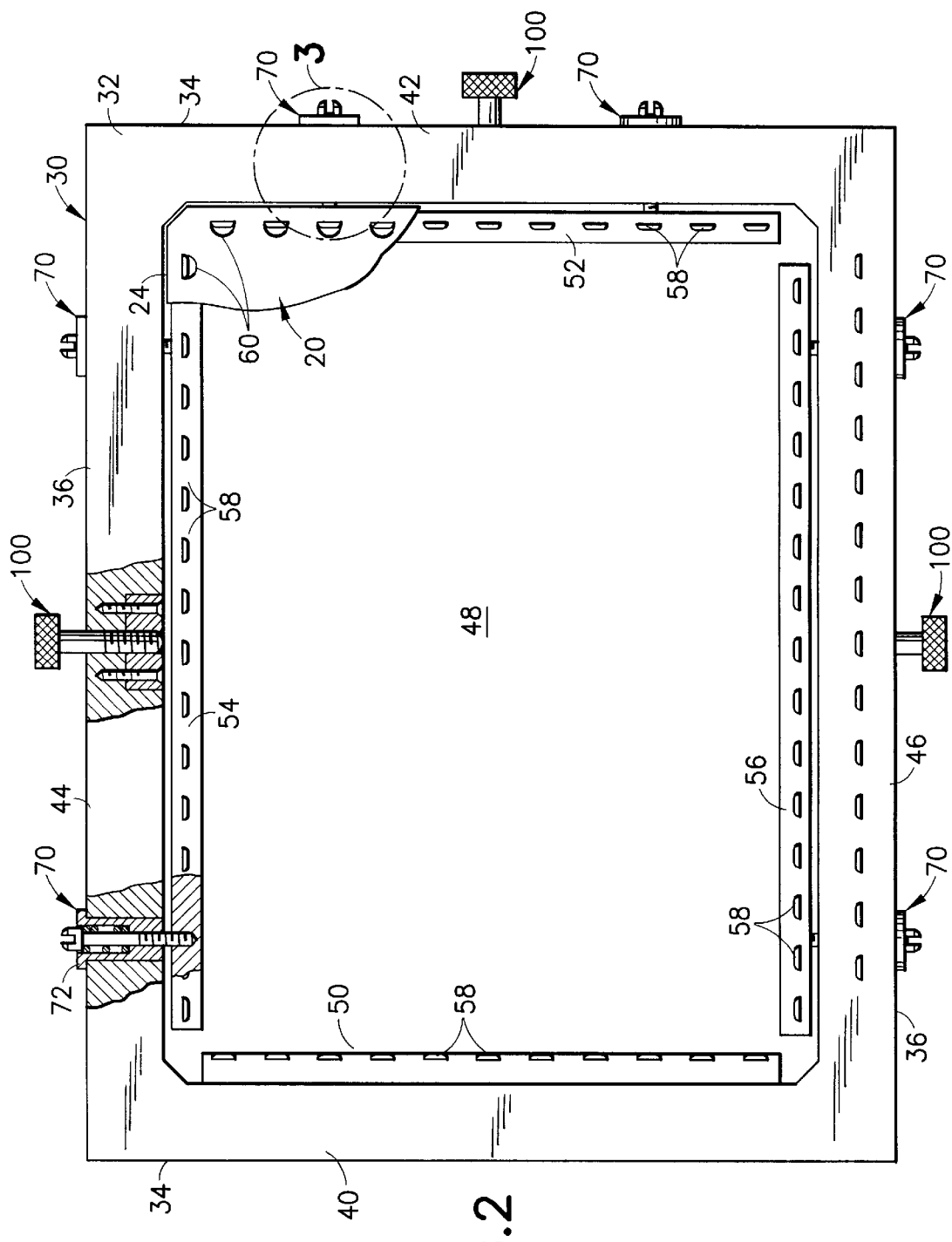
FIG. 2 is a bottom plan view of a frame assembly constructed in accordance with the present invention, showing a fragment of a foil screen tensioned in the frame assembly.

Turning now to FIG. 2, frame assembly 30 includes a rigid frame 32 having a generally rectangular plan configuration extending longitudinally between opposite ends 34 and laterally between opposite sides 36. In the preferred construction illustrated in FIG. 2, the frame 32 includes longitudinally opposite end members 40 and 42 and laterally opposite side members 44 and 46 which form a unitary frame 32 and bound an open area 48 within which the screen 20 is located. Couplers are located adjacent each of the end members 40 and 42 and side members 44 and 46 for engaging the screen 20, adjacent the peripheral edge 24 of the screen 20, the couplers being illustrated in the form of end rails 50 and 52 located within the open area 48 adjacent corresponding end members 40 and 42, and side rails 54 and 56 located within the open area 48 adjacent corresponding side members 44 and 46. The rails 50, 52, 54 and 56 each carry a plurality of posts 58 which are integral with and extend altitudinally from the rails 50, 52, 54 and 56 to enter counterpart apertures in the form of slots 60 in the screen 20, the slots 60 being located adjacent the peripheral edge 24 of the screen 20 and spaced apart along the screen 20 to correspond to the spacing of the posts 58 along the rails 50, 52, 54 and 56.

Figure 3:
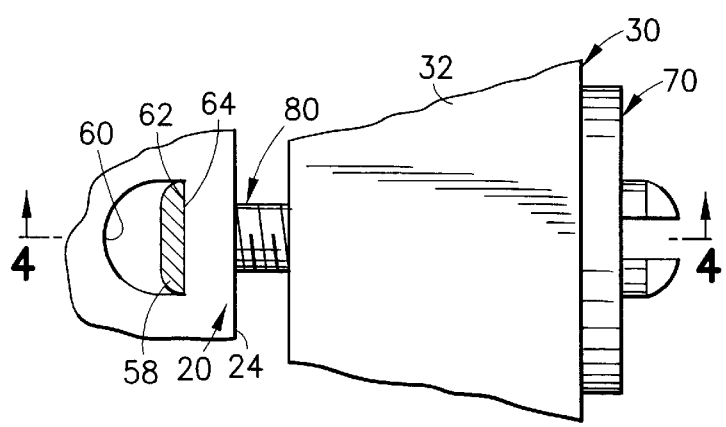
FIG. 3 is an enlarged fragmentary plan view of the portion of FIG. 2 indicated at 3.
Figure 4:
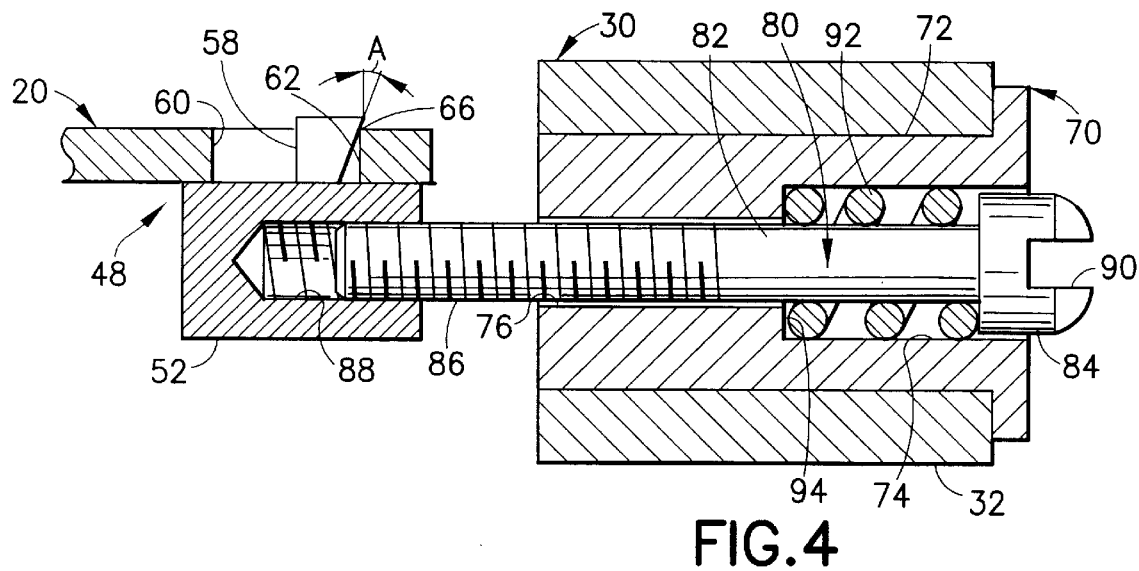
FIG. 4 is a cross-sectional view taken along line 4—4 of FIG. 3.
Figure 5:
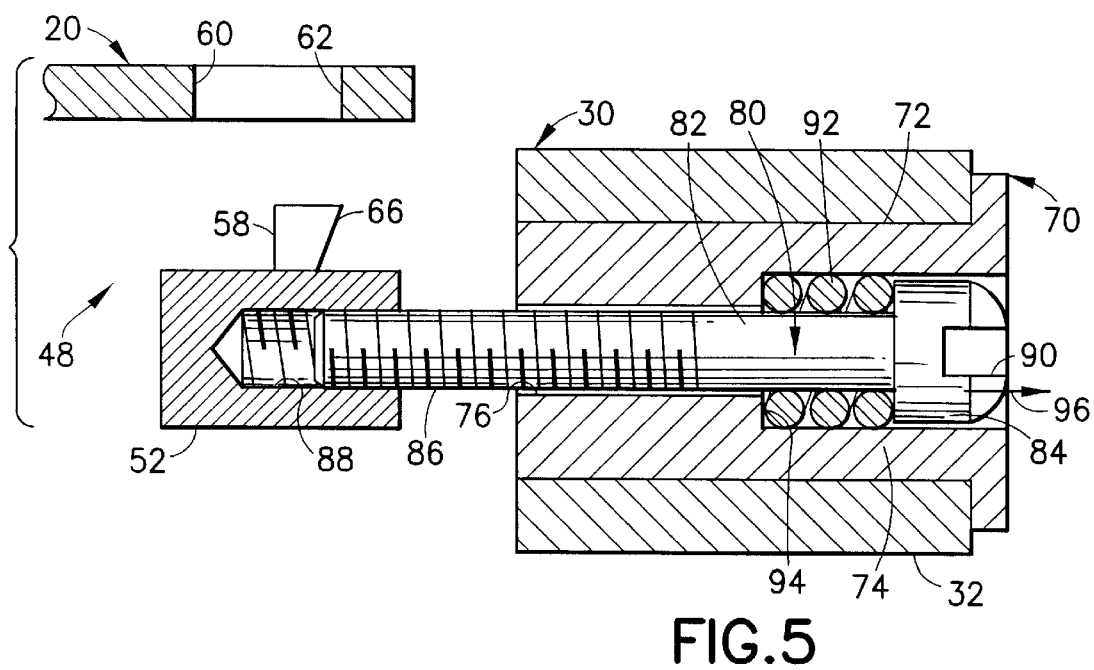
FIG. 5 is a cross-sectional view similar to FIG. 4 and showing the component parts in another operating position.

The screen 20 is coupled with the frame assembly 30 by engaging each post 58 with a corresponding slot 60, as seen in FIGS. 3 through 5. The posts 58 initially are aligned with corresponding slots 60, as illustrated in FIG. 5, and then are engaged with the slots 60, as seen in FIG. 4. The slots 60 have a generally semi-circular plan configuration, as seen in FIG. 3, the plan configuration of each slot 60 including an essentially straight edge 62 adjacent the peripheral edge 24 of the screen 20. The posts 58 have a cross-sectional configuration somewhat complementary to the plan configuration of the slots 60, the cross-sectional configuration being shown in the form of a truncated semi-circular configuration having an essentially straight edge 64 extending transversely along a flat surface 66 of the post 58 for engaging the straight edge 62 of the slot 60. The truncated semi-circular configuration facilitates initial placement of the posts 58 within the slots 60, as described below. Once the screen 20 is coupled with the frame assembly 30, the screen 20 is tensioned, as follows.

Figure 6:
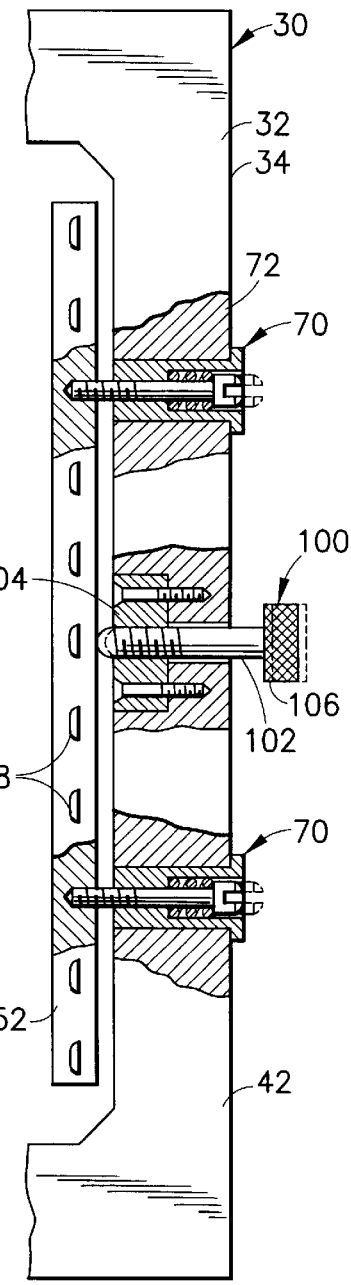
FIG. 6 is an enlarged fragmentary plan view of a portion of the frame assembly, partially sectioned to reveal internal construction details of the frame assembly.

In the illustrated preferred embodiment, rail 50 is affixed to the corresponding end member 40, against movement of the rail 50 relative to the end member 40, while opposite rail 52 is mounted on corresponding end member 42 by means of tensioners 70 extending between rail 52 and end member 42. As best seen in FIG. 6, a pair of tensioners 70 are carried by end member 42 and are engaged with rail 52. Thus, each tensioner 70 includes a bushing 72 secured within the end member 42, against movement relative to the end member 42, the bushing 72 having a larger diameter bore 74 and a smaller diameter bore 76 coaxial with the larger diameter bore 74. A rod 80 slides within the bushing 72 and includes a shank 82 generally complementary to bore 76 and an integral head 84 generally complementary to bore 74. Shank 82 is threaded at 86 and is engaged with a complementary threaded passage 88 in the rail 52, while head 84 is slotted at 90 for selective rotation of the rod 80. A helical compression spring 92 is located within the bore 74 and extends between the head 84 and a confronting end 94 of the bore 74 so as to exert a resilient biasing force on the rod 80, in the direction 96, which resilient biasing force is transmitted to the rail 52 through the threaded connection between the rod 80 and the rail 52. The magnitude of the resilient biasing force is selectively adjustable by rotation of the head 84 to move the rod 80 either further into or further out of the threaded passage 88 of the rail 52, the head 84 and the threaded engagement between the rod 80 and the passage 88 thus serving as an adjuster for selectively adjusting the magnitude of the resilient biasing force.

An actuator 100 is shown in a form which includes a shaft 102 located between the pair of tensioners 70 and threaded through a plate 104 affixed to the end member 52 against movement relative to the end member 52. A thumb wheel 106 on the shaft 102 enables selective turning of the shaft 102 to advance the shaft 102 against the rail 52, as illustrated in full lines in FIG. 6, to move the rail 52 into a release position, against the biasing force of the tensioners 70, the release position being illustrated in FIG. 5. In the release position of the rail 52, the posts 58 are aligned with the slots 60 in the screen 20 for ready engagement or disengagement of the posts 58 and slots 60, enabling placement of the screen 20 within the open area 48, with the posts 58 entering the slots 60, or removal of the screen 20 from the open area 48, with the posts 58 freely withdrawn from the slots 60, all as facilitated by the truncated semi-circular cross-sectional configuration of the posts 58. With the screen 20 placed in the open area 48, and the posts 58 entered within the slots 60, the thumb wheel 106 is rotated to retract the shaft 102 away from the rail 52, as illustrated in phantom in FIG. 6, to enable the rail 52 to move, in the direction 96, to a tensioning position, as illustrated in FIGS. 2 and 4, in response to the biasing force of tensioners 70. Movement of the rail 52 in the direction 96 engages the face 66 of each post 58 with the edge 62 of each corresponding slot 60. Preferably, the face 66 is angled at an acute angle A to the altitudinal direction so as to capture and hold the screen 20 against the rail 52. The preferred magnitude of angle A is about 20°. In this manner, the biasing force, the magnitude of which is selected as described above, is transmitted to the screen 20 so that the screen 20 is tensioned within the frame assembly 30 with a tensioning force of precisely adjusted magnitude.

Each of the rails 54 and 56 is mounted upon a corresponding side member 44 and 46 in precisely the same manner as the mounting of rail 52 upon end member 42, with tensioners 70 and actuators 100 accomplishing movement of each of the rails 54 and 56 between a release position and a tensioning position. Thus, screen 20 is tensioned longitudinally by movement of rail 52 into the tensioning position, and is tensioned laterally by movement of the rails 54 and 56 into respective tensioning positions. In this manner, screen 20 is tensioned within the frame assembly 30 with tensioning forces of precisely adjusted magnitude for precision in locating the openings 22 relative to the circuit board 10.

In the preferred arrangement, end member 42 and side members 44 and 46 each carry at least two tensioners 70 spaced apart along the members 42, 44, 46, and an actuator 100 is located on each member 42, 44 and 46 midway between the spaced apart two tensioners 70, thereby enhancing accuracy and reliability in the tensioning and placement of the screen 20 relative to the frame 32 in the frame assembly 30. The described arrangement enables the tensioners to be pre-set to provide the desired tensioning force, while the actuators 100 allow selective release of the tensioning force for the interchange of screens 20 in the frame assembly 30 without disturbing the magnitude of the pre-set tensioning force. In this manner, the optimum tensioning force may be set at the factory to attain precise calibration, and the user in the field need not be highly skilled and requires no specialized tools or equipment to attain precise tensioning and location of a screen 20 within the frame assembly 30.

It will be seen that the present invention attains the several objects and advantages summarized above, namely: Eliminates the need to stock multiple frames and requires only the stocking of less bulky and more easily handled screens; reduces expense by requiring only a single frame for use with multiple alternative screens; allows speed and accuracy in the changing of foil screens for providing different patterns of solder paste for different circuit boards, without the bulk and expense of multiple frames; attains appropriate tensioning and registration of a foil screen without the necessity for specialized tools and a high degree of skill; facilitates preparations for the soldering of surface mounted components to circuit boards in a variety of patterns; reduces the cost of manufacture of circuit boards by reducing the complexity and number of component parts employed in the manufacture of circuit boards; provides a rugged construction for exemplary performance over a long service life.

It is to be understood that the above detailed description of a preferred embodiment of the invention is provided by way of example only. Various details of design, construction and procedure may be modified without departing from the true spirit and scope of the invention, as set forth in the appended claims.

The embodiments of the invention in which an exclusive property or privilege is claimed are defined as follows:

1. A frame assembly for holding a foil screen in registration with a printed circuit board during the application of solder paste on the printed circuit board, the foil screen having a perimeter and being tensioned within the frame assembly with a prescribed tension, the frame assembly comprising:

a rigid frame for juxtaposition with the foil screen along the perimeter of the foil screen;

couplers for engaging the foil screen adjacent the perimeter of the foil screen;

at least one tensioner carried by the frame and engaged with one of the couplers for resiliently biasing the one coupler to exert a tensioning force of prescribed magnitude upon the foil screen to tension the foil screen with the prescribed tension; and at least one actuator carried by the frame for selectively applying an actuating force to the one coupler, the actuating force being opposite to the tensioning force, and for selectively releasing the actuating force from the one coupler, such that upon actuation of the actuator to apply the actuating force, the tensioning force is overcome for release of the foil screen from the one coupler, and upon actuation of the actuator to release the actuating force, the one tensioner resiliently biases the one coupler to exert the tensioning force of prescribed magnitude upon the foil screen.

2. The frame assembly of claim 1 including at least two tensioners carried by the frame and engaged with the one coupler, the two tensioners being spaced apart along the frame, and the one actuator being located between the two tensioners.

3. The frame assembly of claim 1 wherein the tensioner includes:

a spring having a biasing force for establishing the tensioning force; and an adjuster for selectively adjusting the biasing force of the spring to attain the prescribed magnitude of the tensioning force.

4. The frame assembly of claim 1 wherein the foil screen includes a plurality of apertures along the periphery of the foil screen, and the one coupler includes:

a rail mounted upon the frame for movement, in response to actuation of the actuator, between a tensioning position, wherein the tensioner resiliently biases the rail to exert the tensioning force, and a release position, wherein the tensioning force is overcome;

a plurality of posts affixed to the rail for projecting into apertures of the foil screen to couple the rail with the foil screen such that the tensioning force tensions the foil screen with the prescribed tension when the rail is in the tensioning position, and the tensioning force is released when the rail is in the release position.

5. The frame assembly of claim 4 wherein the tensioner includes:

a spring having a biasing force for establishing the tensioning force; and an adjuster for selectively adjusting the biasing force of the spring to attain the prescribed magnitude of the tensioning force.

6. The frame assembly of claim 4 including at least two tensioners carried by the frame and engaged with the one coupler, the two tensioners being spaced apart along the frame, and the one actuator being located between the two tensioners.

7. The frame assembly of claim 4 wherein the actuator includes a threaded bore in the frame and a threaded shaft engaged in the threaded bore for advancement to move the rail toward the release position and for retraction to allow movement of the rail toward the tensioning position.

8. The frame assembly of claim 4 wherein the apertures in the foil screen are slots having a generally semi-circular plan configuration and the posts have a complementary truncated semi-circular cross-sectional configuration.

9. The frame assembly of claim 8 wherein the posts each include an essentially flat face extending in a generally altitudinal direction for engaging the foil screen at the apertures.

10. The frame assembly of claim 9 wherein the face of each post makes an acute angle with the altitudinal direction.

11. The frame assembly of claim 1 wherein the foil screen has a generally rectangular plan configuration and the one coupler is located at one side of the rectangular configuration.

12. The frame assembly of claim 1 wherein the foil screen has a generally rectangular plan configuration and the frame assembly includes at least two couplers, the two couplers being located along adjacent sides of the rectangular configuration, a tensioner engaged with each coupler, and an actuator for selectively applying an actuating force to each coupler.

13. The frame assembly of claim 1 wherein the foil screen has a generally rectangular plan configuration and the frame assembly includes three couplers, the three couplers being located along adjacent sides of the rectangular configuration, a tensioner engaged with each coupler, and an actuator for selectively applying an actuating force to each coupler.

14. The frame assembly of claim 13 wherein each tensioner includes:

a spring having a biasing force for establishing the tensioning force; and an adjuster for selectively adjusting the biasing force of the spring to attain the prescribed magnitude of the tensioning force.

15. The frame assembly of claim 13 including at least two tensioners carried by the frame and engaged with the one coupler, the two tensioners being spaced apart along the frame, and the one actuator being located between the two tensioners.

16. The frame assembly of claim 13 wherein the foil screen includes a plurality of apertures along the periphery of the foil screen, and each coupler includes:

a rail mounted upon the frame for movement, in response to actuation of the actuator, between a tensioning position, wherein the tensioner resiliently biases the rail to exert the tensioning force, and a release position, wherein the tensioning force is overcome; and a plurality of posts affixed to the rail for projecting into apertures of the foil screen to couple the rail with the foil screen such that the tensioning force tensions the foil screen with the prescribed tension when the rail is in the tensioning position, and the tensioning force is released when the rail is in the release position.

17. The frame assembly of claim 16 wherein each tensioner includes:

a spring having a biasing force for establishing the tensioning force; and an adjuster for selectively adjusting the biasing force of the spring to attain the prescribed magnitude of the tensioning force.

18. The frame assembly of claim 13 wherein each actuator includes a threaded bore in the frame and a threaded shaft engaged in the threaded bore for advancement to move the rail toward the release position and for retraction to allow movement of the rail toward the tensioning position.

19. The frame assembly of claim 13 wherein the apertures in the foil screen are slots having a generally semi-circular plan configuration and the posts have a complementary truncated semi-circular cross-sectional configuration.

20. The frame assembly of claim 19 wherein the posts each include an essentially flat face extending in a generally altitudinal direction for engaging the foil screen at the apertures.

21. The frame assembly of claim 20 wherein the face of each post makes an acute angle with the altitudinal direction.

* * * * *